United States Patent
Yamazaki et al.

(10) Patent No.: US 7,485,584 B2
(45) Date of Patent: *Feb. 3, 2009

(54) LIGHT EMITTING DEVICE AND METHOD OF MANUFACTURING THEREOF

(75) Inventors: Shunpei Yamazaki, Tokyo (JP); Satoshi Seo, Kanagawa (JP)

(73) Assignee: Semiconductor Energy Laboratory Co., Ltd., Kanagawa-Ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/707,099

(22) Filed: Feb. 16, 2007

(65) Prior Publication Data

US 2007/0275490 A1 Nov. 29, 2007

Related U.S. Application Data

(62) Division of application No. 10/147,923, filed on May 20, 2002, now Pat. No. 7,179,756.

(30) Foreign Application Priority Data

May 21, 2001 (JP) ............... 2001-151572

(51) Int. Cl.
  *H01L 21/31* (2006.01)
(52) U.S. Cl. ............... 438/780; 438/237; 438/238; 257/E51.018; 257/E51.022; 257/E51.026; 257/E31.099; 257/E31.105; 427/421.1; 427/427.3; 427/447
(58) Field of Classification Search ............... 438/149, 438/237, 328, 780, 949, FOR. 157, FOR. 201, 438/FOR. 287, FOR. 416; 427/66, 447, 421.1, 427/427.5; 257/E51.018, E51.022, E51.026, 257/E31.099, E31.105
See application file for complete search history.

(56) References Cited

U.S. PATENT DOCUMENTS 4,617,195 A  10/1986  Mental (Continued)

FOREIGN PATENT DOCUMENTS

EP  0892028 A2  1/1999

(Continued)

OTHER PUBLICATIONS (English Translation of Chinese Office Action issued Dec. 9, 2005) Applicant: Semiconductor Energy Laboratory Co., Ltd.; Chinese Patent Application No. 02120302.4; filed May 21, 2002; "Light Emitting Device and Method of Manufacturing Thereof".

(Continued)

*Primary Examiner*—Michelle Estrada
(74) *Attorney, Agent, or Firm*—Nixon Peabody LLP; Jeffrey L. Costellia

(57) ABSTRACT

A device of forming a film from an organic compound material at low cost is provided, using an organic compound material having high light emission efficiency. An organic compound film is formed on a substrate under an inert gas atmosphere by spraying of a colloid solution in which organic compound aggregates are dispersed (this solution is also referred to as a "sol"). Note that the organic compound may be one in which particles are composed of aggregates of several organic compounds within a liquid, and may be one in which a portion of the organic compound is dissolved within a liquid.

19 Claims, 10 Drawing Sheets

U.S. PATENT DOCUMENTS

| | | |
|---|---|---|
| 5,405,724 A | 4/1995 | Hsieh et al. |
| 5,543,177 A | 8/1996 | Morrison et al. |
| 5,585,213 A | 12/1996 | Tamano et al. |
| 5,650,197 A | 7/1997 | Halpern |
| 5,698,740 A | 12/1997 | Enokida et al. |
| 5,703,436 A | 12/1997 | Forrest et al. |
| 5,821,002 A | 10/1998 | Ohnishi et al. |
| 5,843,527 A | 12/1998 | Sanada |
| 5,851,274 A | 12/1998 | Lin |
| 5,891,587 A | 4/1999 | Hu et al. |
| 5,895,692 A | 4/1999 | Shirasaki et al. |
| 5,903,101 A | 5/1999 | Kijima |
| 5,921,836 A | 7/1999 | Nanto et al. |
| 5,948,552 A | 9/1999 | Antoniadis et al. |
| 5,968,675 A | 10/1999 | Tamano et al. |
| 6,013,982 A | 1/2000 | Thompson et al. |
| 6,049,167 A | 4/2000 | Onitsuka et al. |
| 6,066,712 A | 5/2000 | Ueda et al. |
| 6,114,088 A | 9/2000 | Wolk et al. |
| 6,140,009 A | 10/2000 | Wolk et al. |
| 6,160,346 A | 12/2000 | Vleggaar et al. |
| 6,168,731 B1 | 1/2001 | Hampden-Smith et al. |
| 6,171,765 B1 | 1/2001 | Sheats |
| 6,174,613 B1 | 1/2001 | Antoniadis et al. |
| 6,194,119 B1 | 2/2001 | Wolk et al. |
| 6,197,365 B1 | 3/2001 | Bachinger et al. |
| 6,207,301 B1 | 3/2001 | Ohnishi et al. |
| 6,214,520 B1 | 4/2001 | Wolk et al. |
| 6,214,631 B1 | 4/2001 | Burrows et al. |
| 6,215,462 B1 | 4/2001 | Yamada et al. |
| 6,221,553 B1 | 4/2001 | Wolk et al. |
| 6,228,555 B1 | 5/2001 | Hoffend, Jr. et al. |
| 6,242,152 B1 | 6/2001 | Staral et al. |
| 6,245,393 B1 | 6/2001 | Thompson et al. |
| 6,258,954 B1 | 7/2001 | Kunimoto et al. |
| 6,259,202 B1 | 7/2001 | Sturm et al. |
| 6,264,805 B1 | 7/2001 | Forrest et al. |
| 6,270,944 B1 | 8/2001 | Wolk et al. |
| 6,281,552 B1 | 8/2001 | Kawasaki et al. |
| 6,284,425 B1 | 9/2001 | Staral et al. |
| 6,291,116 B1 | 9/2001 | Wolk et al. |
| 6,291,126 B2 | 9/2001 | Wolk et al. |
| 6,306,559 B1 | 10/2001 | Tanamura et al. |
| 6,310,231 B1 | 10/2001 | Igarashi et al. |
| 6,312,837 B1 | 11/2001 | Kijima |
| 6,319,321 B1 | 11/2001 | Hiraga et al. |
| 6,440,877 B1 | 8/2002 | Yamazaki et al. |
| 6,495,313 B1 | 12/2002 | Yoshioka et al. |
| 6,503,831 B2 | 1/2003 | Speakman |
| 6,614,076 B2 | 9/2003 | Kawasaki et al. |
| 6,634,806 B2 | 10/2003 | Toshima et al. |
| 6,696,105 B2 | 2/2004 | Hiroki et al. |
| 6,699,739 B2 | 3/2004 | Yamazaki et al. |
| 6,706,647 B1 | 3/2004 | Tsutsumi et al. |
| 6,730,357 B2 | 5/2004 | Kawase |
| 6,809,382 B2 | 10/2004 | Kawasaki et al. |
| 6,830,494 B1 | 12/2004 | Yamazaki et al. |
| 6,843,937 B1 | 1/2005 | Kiguchi et al. |
| 6,878,312 B1 | 4/2005 | Kanbe et al. |
| 7,132,687 B2 | 11/2006 | Kawasaki et al. |
| 7,179,756 B2 | 2/2007 | Yamazaki et al. |
| 7,199,515 B2 | 4/2007 | Seo et al. |
| 2001/0001050 A1 | 5/2001 | Miyashita et al. |
| 2001/0003602 A1 | 6/2001 | Fujita |
| 2001/0009691 A1 | 7/2001 | Thompson et al. |
| 2001/0017409 A1 | 8/2001 | Hiroki et al. |
| 2001/0023661 A1 | 9/2001 | Hiroki et al. |
| 2001/0041392 A1 | 11/2001 | Suzawa et al. |
| 2001/0050364 A1 | 12/2001 | Tanaka et al. |
| 2002/0033335 A1 | 3/2002 | Terashima et al. |
| 2002/0043214 A1 | 4/2002 | Inada et al. |
| 2002/0044140 A1 | 4/2002 | Inukai |
| 2002/0047567 A1 | 4/2002 | Fujita et al. |
| 2002/0061418 A1 | 5/2002 | Imanishi |
| 2002/0113248 A1 | 8/2002 | Yamagata et al. |
| 2002/0130312 A1 | 9/2002 | Yu et al. |
| 2002/0187567 A1 | 12/2002 | Yamazaki et al. |
| 2002/0197393 A1 | 12/2002 | Kuwabara |
| 2002/0197394 A1 | 12/2002 | Yamazaki et al. |
| 2003/0008429 A1 | 1/2003 | Yamazaki et al. |
| 2003/0040137 A1 | 2/2003 | Kim |
| 2003/0052327 A1 | 3/2003 | Kwasnick et al. |
| 2005/0035708 A1 | 2/2005 | Yamazaki et al. |
| 2005/0058770 A1 | 3/2005 | Kiguchi et al. |
| 2005/0156148 A1 | 7/2005 | Kanbe et al. |

FOREIGN PATENT DOCUMENTS

| | | |
|---|---|---|
| EP | 0 999 595 A2 | 5/2000 |
| EP | 1021070 A1 | 7/2000 |
| EP | 1058314 A2 | 12/2000 |
| EP | 1 093 167 A2 | 4/2001 |
| EP | 1394236 A1 | 3/2004 |
| JP | 06-082796 | 3/1994 |
| JP | 10-270169 | 10/1998 |
| JP | 11-040358 | 2/1999 |
| JP | 2000-208252 | 7/2000 |
| JP | 2000-340801 | 12/2000 |
| JP | 2001-093673 | 4/2001 |
| JP | 2001-230075 | 8/2001 |
| JP | 2001-297876 A | 10/2001 |
| JP | 2001-326178 | 11/2001 |
| JP | 2001-353454 | 12/2001 |
| JP | 2002-075641 | 3/2002 |
| WO | WO-00/59267 | 10/2000 |

OTHER PUBLICATIONS

U.S. Appl. No. 09/580,485, filed May 30, 2000.

Kido.J et al., "Bright Blue Electroluminescence From Poly(N-Vinylcarbzole)," Applied Physics Letters, Nov. 8, 1993, vol. 63, No. 19, pp. 2627-2629.

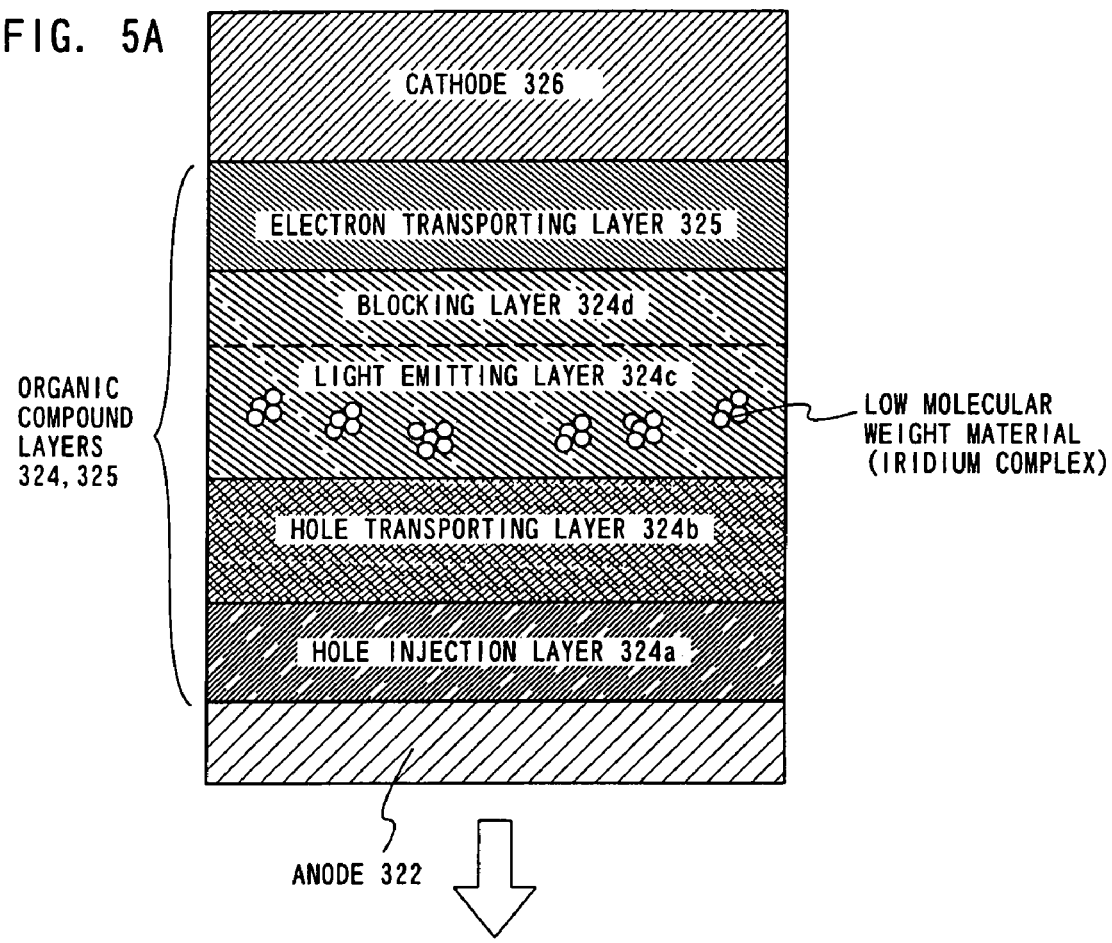
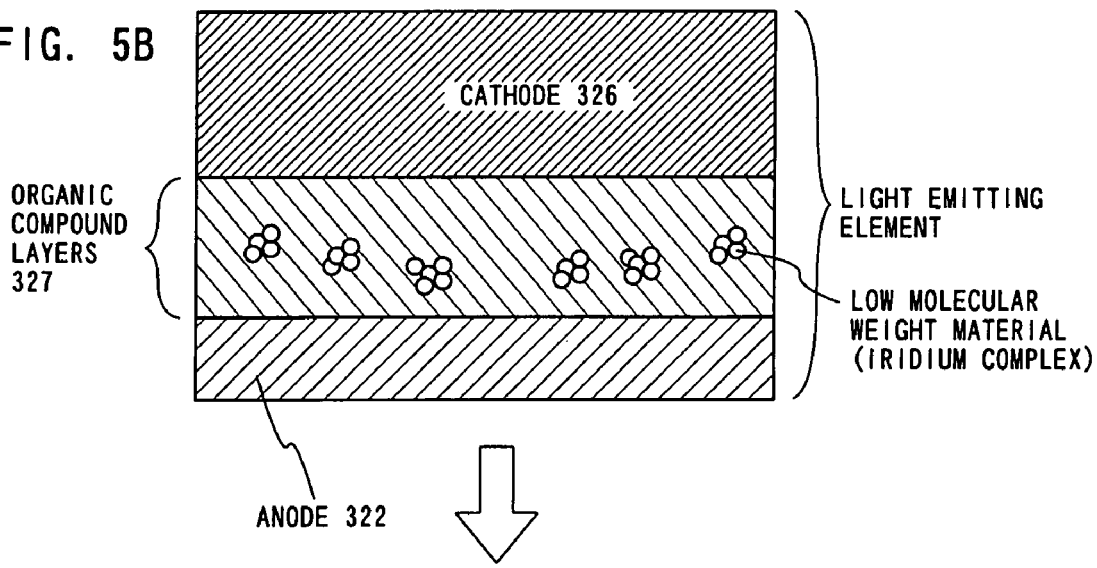

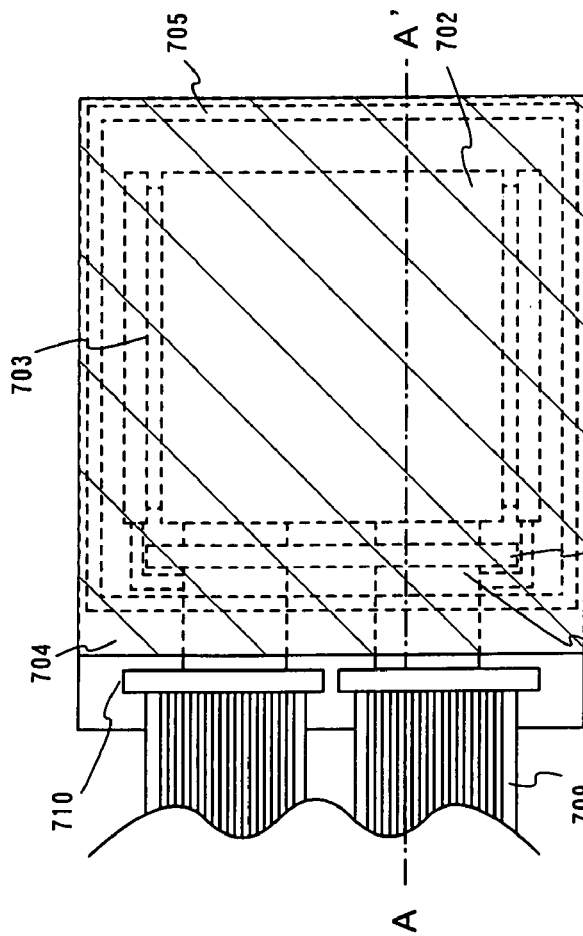
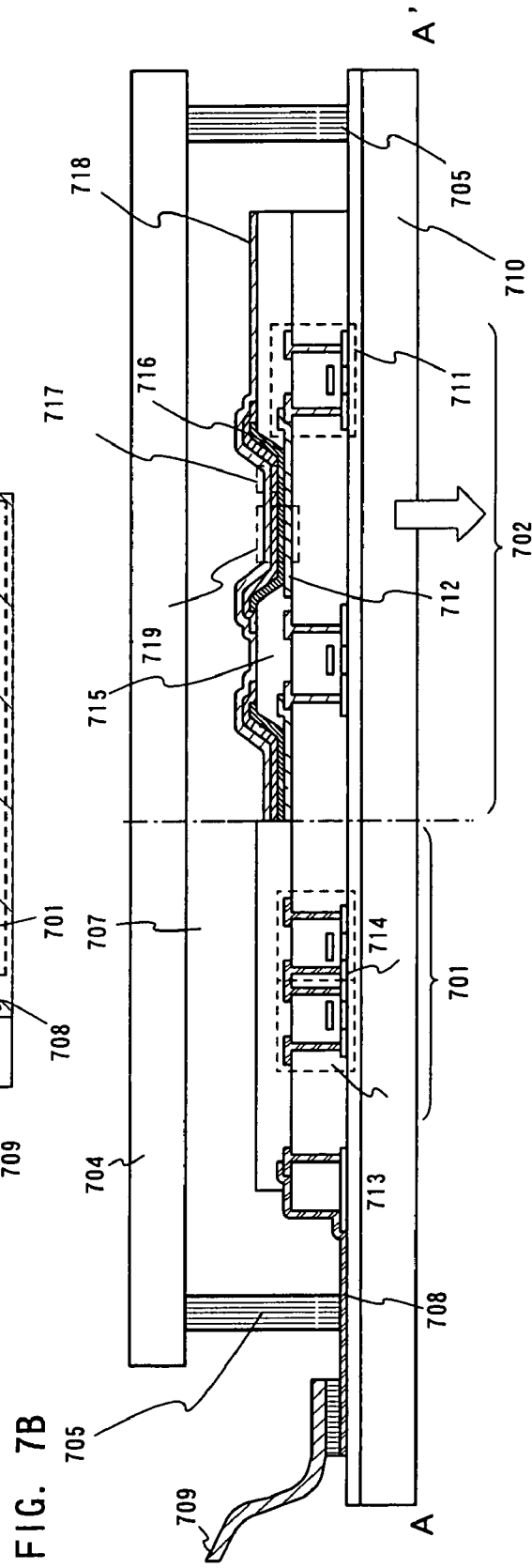
FIG. 7A
FIG. 7B

LIGHT EMITTING DEVICE AND METHOD OF MANUFACTURING THEREOF

This application is a Divisional of application Ser. No. 10/147,923 Filed May 20, 2002 now U.S. Pat. No. 7,179,756.

BACKGROUND OF THE INVENTION

1. Field of the Invention

The present invention relates to a light emitting device formed by building a semiconductor element (element using a semiconductor thin film) onto a substrate using a light emitting element that has a film (hereafter referred to as an "organic compound layer") containing an organic compound in which fluorescence or phosphorescence is obtained by the application of an electric field, typically an EL (electro luminescence) display device. In addition, the present invention relates to electronic equipment that uses an EL display device as a display (display portion). Note that light emitting devices are also referred to as OLEDs (organic light emitting diodes).

Note that the term "light emitting element" in this specification indicates elements in which an organic compound layer is formed between a pair of electrodes. The term "light emitting device" indicates image display devices using light emitting elements or light emitting devices. Further, modules in which a connector, for example, an anisotropic conductive film (flexible printed circuit, FPC), a TAB (tape automated bonding) tape, or a TCP (tape carrier package) is attached to light emitting elements, modules in which the tip of the TAB tape or TCP is provided with a printed wiring board, and modules in which an IC (integrated circuit) is directly mounted to light emitting elements by a COG (chip on glass) method are all included in the category of light emitting devices.

2. Description of the Related Art

The development of light emitting devices (EL display devices) using EL elements as light emitting elements that utilize EL (electro luminescence) phenomenon of light emitting organic materials has recently been advancing. This is because it is considered that the EL display devices have a wider angle of view and superior visibility, compared to conventional liquid crystal display devices.

Further, there are two types of EL display devices, a passive type (simple matrix type) and an active type (active matrix type), and the development of both the types is flourishing. In particular, active matrix EL display devices are in the spotlight at present. Furthermore, organic compound materials which become EL layers (strictly speaking, light emitting layers), the EL element center, can be divided into low molecular weight organic compound materials and high molecular weight (polymer) organic compound materials, and both the materials are being researched.

Inkjet printing, evaporation, and spin coating methods are known as methods of forming a film of these organic compound materials.

However, when considering the manufacture of a full color flat panel display with the use of red, green, and blue light emission colors, none of the aforementioned film formation methods can be called ideal for a variety of reasons, and this has been a problem for low cost, large-scale production.

SUMMARY OF THE INVENTION

An object of the present invention is thus to provide a means for forming a film made from an organic compound material at low cost using an organic compound material having high light emission efficiency.

Further, organic compound materials generally used in light emitting elements are high cost. Therefore it is preferable to use such materials as effectively as possible.

With the present invention, a film containing organic compound aggregates is formed on a substrate under an inert gas atmosphere by spraying of a colloid solution (also referred to as a sol) in which the organic compound aggregates are dispersed. Note that, in the present invention, the organic compound exists within a liquid as particles in which several organic compounds aggregate.

Conventionally, a solution in which an organic compound material is dissolved in a solvent that has high solubility with respect to the organic compound material is manufactured, and film formation is performed by an inkjet printing method or a spin coating method.

An organic compound material having high solubility is preferably used in the conventional film formation methods. Further, in order to increase the solubility of organic compound materials having low solubility, a molecular structure in which substituents are introduced is used, thereby increasing the solubility. However, the color purity is reduced by the introduction of the substituents, and in addition, the color of light emission changes. For example, the color of light emitted from an organic compound material denoted by PPV (1,4-polyphenylene vinylene) is green, but an organic compound material denoted by RO-PPV (2,5-dialkoxy-1,4-phenylene vinylene), in which an alkoxy substituent is introduced in order to increase solubility, is orange.

Further, among the large number of organic compound materials in existence, materials capable of converting triplet excitation energy into light emission, for example, metal complexes having platinum as a central metal (hereafter referred to as "platinum complexes") or metal complexes having iridium as a central metal (hereafter referred to as "iridium complexes") as dopants are mixed with a plurality of other organic compound materials and solvents, and therefore it is difficult to perform synthesis while regulating the ratios that the individual components occupy with respect to the whole.

The present invention relates to a means capable of forming a film by using an organic compound material (high molecular weight material or low molecular weight material) within a liquid in any state. In particular, good quality-organic compound films can be formed using organic compound materials that are difficult to dissolve. Film formation is performed by spraying a liquid containing an organic compound by using a carrier gas in the present invention, and therefore film formation is possible in a short period of time. Note that, in this specification, the term "film formation" indicates that thermal firing is performed, vaporizing solvent (liquid) after forming a film selectively or over an entire surface by spraying. Further, an extremely simple method can be used for the method of manufacturing the liquid containing the organic compound to be sprayed. A mask is used for cases in which a film having a desired pattern is to be formed with the present invention, and film formation is performed through an opening portion in the mask. Further, in order to very efficiently use high cost organic compound materials, the organic compound material adhering to the mask is collected, making it possible to again utilize the material.

According to an aspect of the present invention disclosed in this specification, there is provided a method of manufacturing a light emitting device, characterized in that a composition which has organic compound aggregates as distributed particles and has a dispersion medium as a liquid is sprayed onto an object from a nozzle by using an inert gas, forming a film containing the organic compound aggregates.

Further, according to another aspect of the present invention, there is provided a method of manufacturing a light emitting device for controlling the position at which a film containing organic compound aggregates is formed, characterized in that a composition which has organic compound aggregates as distributed particles and has a dispersion medium as a liquid is sprayed from a nozzle onto an object through an opening portion of a mask disposed between the nozzle and the object by using an inert gas, thus forming a film containing the organic compound aggregates.

In the above structure, the composition or the mask may be electrically charged in order to control the position at which the film containing the organic compound aggregates is formed.

Further, in each of the above structures, the composition is a liquid having fluidity, and the organic compound aggregates within the liquid are dispersed as colloid particles.

In addition, in each of the aforementioned structures, the organic compound is one compound or a plurality of compounds, selected from the group consisting of quinacridon, tris(2-phenylpyridine) iridium, and basocuproin.

Further, in each of the aforementioned structures, the organic compound is one compound or a plurality of compounds, selected from the group consisting of poly(1,4-phenylene vinylene), poly(1,4-naphthalene vinylene), poly(2-phenyl-1,4-phenylene vinylene), polythiophene, poly(3-phenylthiophene), poly(1,4-phenylene), and poly(2,7-fluorene).

In the present invention, the organic compound may be particles in which a plurality of organic compounds aggregate within a liquid, and may be an organic compound in which a portion is dissolved within a liquid.

Therefore, a film containing an organic compound may be formed by spraying onto an object a composition in which the organic compound is dissolved in a liquid. Another aspect of the present invention is a method of manufacturing a light emitting device characterized in that a film containing an organic compound is formed by spraying a composition, in which the organic compound is dissolved in a liquid, from a nozzle onto an object by using an inert gas.

Further, according to another aspect of the present invention, there is provided a method of manufacturing a light emitting device for controlling the position at which a film containing an organic compound is formed, characterized in that a composition in which the organic compound is dissolved in a liquid is sprayed from a nozzle onto an object through an opening portion of a mask disposed between the nozzle and the object by using an inert gas, thus forming a film containing the organic compound.

In addition, the composition or the mask may also be electrically charged in order to control the position at which the film containing the organic compound is formed.

Note that in the aforementioned structure, the composition is a liquid having fluidity, and at least a portion of the organic compound is dissolved within the liquid.

Further, in each of the above structures, the liquid is one liquid or a plurality of liquids, selected from the group consisting of alcohols, toluene, and, water.

In addition, in each of the above structures, film formation is performed under an inert gas atmosphere.

Furthermore, in each of the above structures, the nozzle is provided with one or more spray outlets.

In each of the above structures, the object is a substrate on which a switching element is formed.

Further, in each of the above structures, a film may be formed on the object while moving the object, or a film may also be formed on the object while moving the nozzle.

In each of the above structures, an electric field may be generated between the nozzle and the object in order to control the position of film formation.

BRIEF DESCRIPTION OF THE DRAWINGS

In the accompanying drawings:
FIGS. 5A and 5B are diagrams showing the structure of an organic compound layer;
FIGS. 7A and 7B are diagrams showing the external appearance of an EL module.

DETAILED DESCRIPTION OF THE PREFERRED EMBODIMENTS

Embodiment mode

An embodiment mode of the present invention is explained below.

Figure 2A:
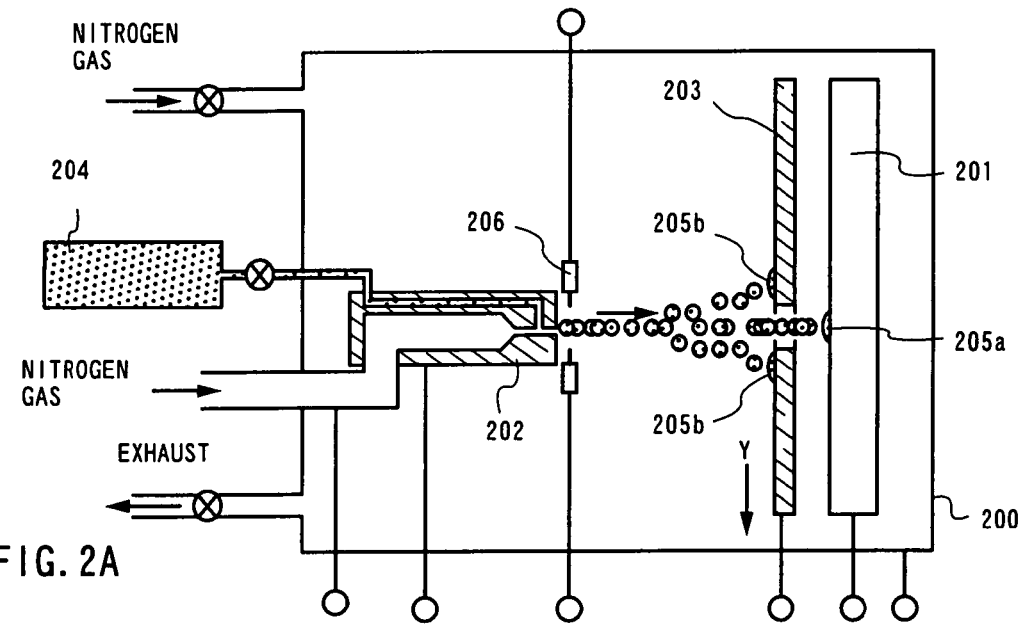
FIGS. 2A to 2C are diagrams showing the present invention.

FIG. 2A is a simplified diagram of the present invention.
In FIG. 2A, a substrate 201, a mask 203, and a nozzle 202 are disposed within a chamber 200, and a spray outlet of the nozzle 202 is pointed toward the substrate. Further, the atmosphere within the chamber is controlled to be an inert gas atmosphere (nitrogen atmosphere here). Further, a vessel 201 is disposed at a position isolated from the chamber 200, and a liquid 204 containing an organic compound is contained in the vessel. The liquid has fluidity, and aggregates of the organic compound are dispersed within the liquid as colloid particles.

Note that a low molecular weight iridium complex that has high light emission efficiency, typically tris(2-phenyl pyridine)iridium, is used as the organic compound here. The molecular formula of this iridium complex is shown below.

[Chem 1]

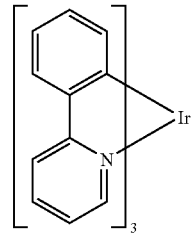

The iridium complex, or aggregates of the iridium complex, and basocuproin (hereafter referred to as BCP) are dispersed as colloid particles within a toluene of alcohol liquid.

If an application method is used, an application liquid in which 2-(4-biphenyl)-5-(4-tert-butylphenyl)-1,3,4-oxadiazole (referred to as PBD) and poly(N-vinyl carbazole) (referred to as PVK) are dissolved at a certain ratio in a toluene solvent, with several wt % of an iridium complex dispersed as a dopant within the liquid, is prepared. It is complex to prepare this application liquid, but the liquid 204 of the present invention can be obtained easily and in a short amount of time.

Further, coupled to the nozzle 202 are a pipe extending from a carrier gas introduction port and a pipe extending from the vessel containing the liquid that contains the organic compound. The liquid 204 within the vessel is made to move from the vessel, turned into a mist state with a carrier gas (nitrogen gas here), and is sprayed, by utilizing a pressure difference developing due to the Bernoulli theorem (the difference between the pressure before the spray outlet and the pressure neat the spray outlet), and a flow rate difference, which are attained by flowing the carrier gas toward the nozzle-spray-outlet. The spray capable nozzle is also referred to as a spray gun. Note that the liquid 204 is a liquid having a viscosity such as to allow it to be sprayed from the nozzle 202. Note also that inert gasses such as nitrogen, argon, helium, and neon can be used as the carrier gas. Although not shown in the figures, an apparatus for controlling the flow rate of the carrier gas is also included. In addition, an apparatus for controlling the flow rate of the liquid 204 may also be used. Further, a mask 203 is formed between the spray outlet and the substrate in order to selectively form a layer 205a containing the organic compound. Note that the mask 203 need not be formed for cases in which the layer is formed over the entire surface.

Another spraying method comprises: causing the liquid to move from the vessel by using a compressed gas source (not shown in the figures); flowing the carrier gas toward the spray outlet of the nozzle to form within the chamber a spray comprising the liquid and the gas and discharging the spray thus obtained. The parts used here are trivial, and therefore are not shown in detail in the figures. Further, an apparatus for controlling the flow rate of the liquid may also be used.

Figure 2B:
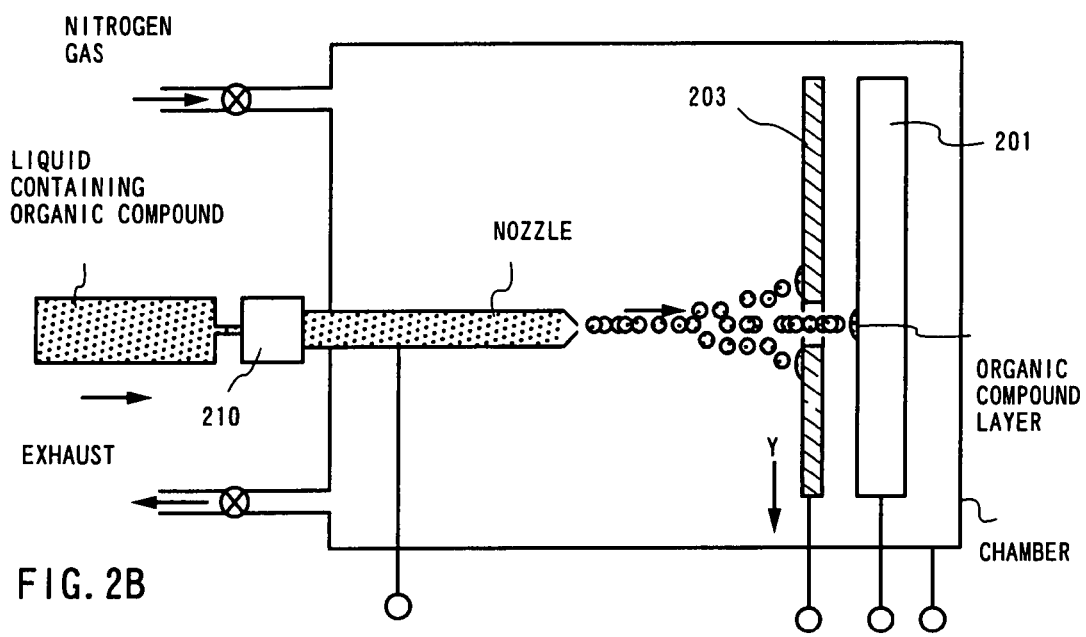

Another spraying method may also be used, in which the pressure of the pipe from the vessel to the nozzle is increased by using a compressor pump 210 or the like, as shown in FIG. 2B, thereby making the liquid flow toward the spray outlet of the nozzle to form within the chamber a spray composed only of the liquid, and the spray thus obtained is discharged.

Figure 2C:
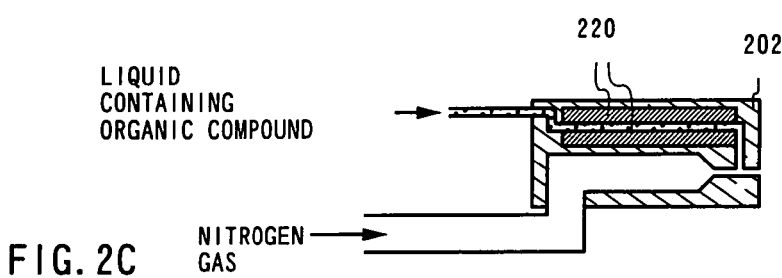

Furthermore, it is preferable that the organic compound be dispersed uniformly within the liquid, as shown in FIG. 2C, and in the pipe communicating the vessel with the spray outlet, the nozzle 202 itself may be vibrated by an ultrasonic vibration means 220. A stirrer or an ultrasonic generator may also be established in the inside of the vessel for performing dispersion.

The liquid sprayed by any one of the above-mentioned spraying methods which passed through the opening portion of the mask adheres to the substrate 201, and the layer 205a containing the organic compound aggregates is deposited thereon. Note that the position for film formation may be appropriately controlled by giving an electric charge to or by grounding the liquid, using an electrode or the like formed in the nozzle or within the vessel or the chamber. A ring shape charging means 206, for example a corona discharge electrode, may be formed in the spray outlet of the nozzle as shown in FIG. 2A. However, the charging means 206 need not be formed.

If spraying as discussed above is then performed intermittently or continuously while moving the substrate in the X direction or the Y direction, a desired pattern can be obtained.

Further, the desired pattern can also be obtained by fixing the substrate and scanning the nozzle in the X direction or in the Y direction.

A substrate heater may also be formed in contact with the substrate and the substrate may be heated during film formation. The surface temperature of the substrate may be set from room temperature up to 200° C. with the present invention. In this case, only the liquid is vaporized immediately after spraying, and the layer containing the organic compound aggregates can be formed.

Further, organic compound 205b adhering to the mask during formation of the organic compound layer 205a is collected and can be used again.

An example of using an iridium complex is explained here, but it is also possible to apply the following to the present invention: other low molecular weight materials (such as quinacridon and basocuproin), and in addition, high molecular weight materials (such as poly(1,4-phenylene vinylene), poly(1,4-naphthalene vinylene, poly(2-phenyl-1,4-phenylene vinylene), polythiophene, poly(3-phenylthiophene), poly(1,4-phenylene), and poly(2,7-fluorene)).

Note that, for simplicity a substrate holder for fixing the substrate and a holder for fixing the mask are not shown in FIGS. 2A and 2B.

Further, an example in which there is one spray outlet of the nozzle 202 is shown here, but a plurality of spray outlets may also be used.

Figure 1:
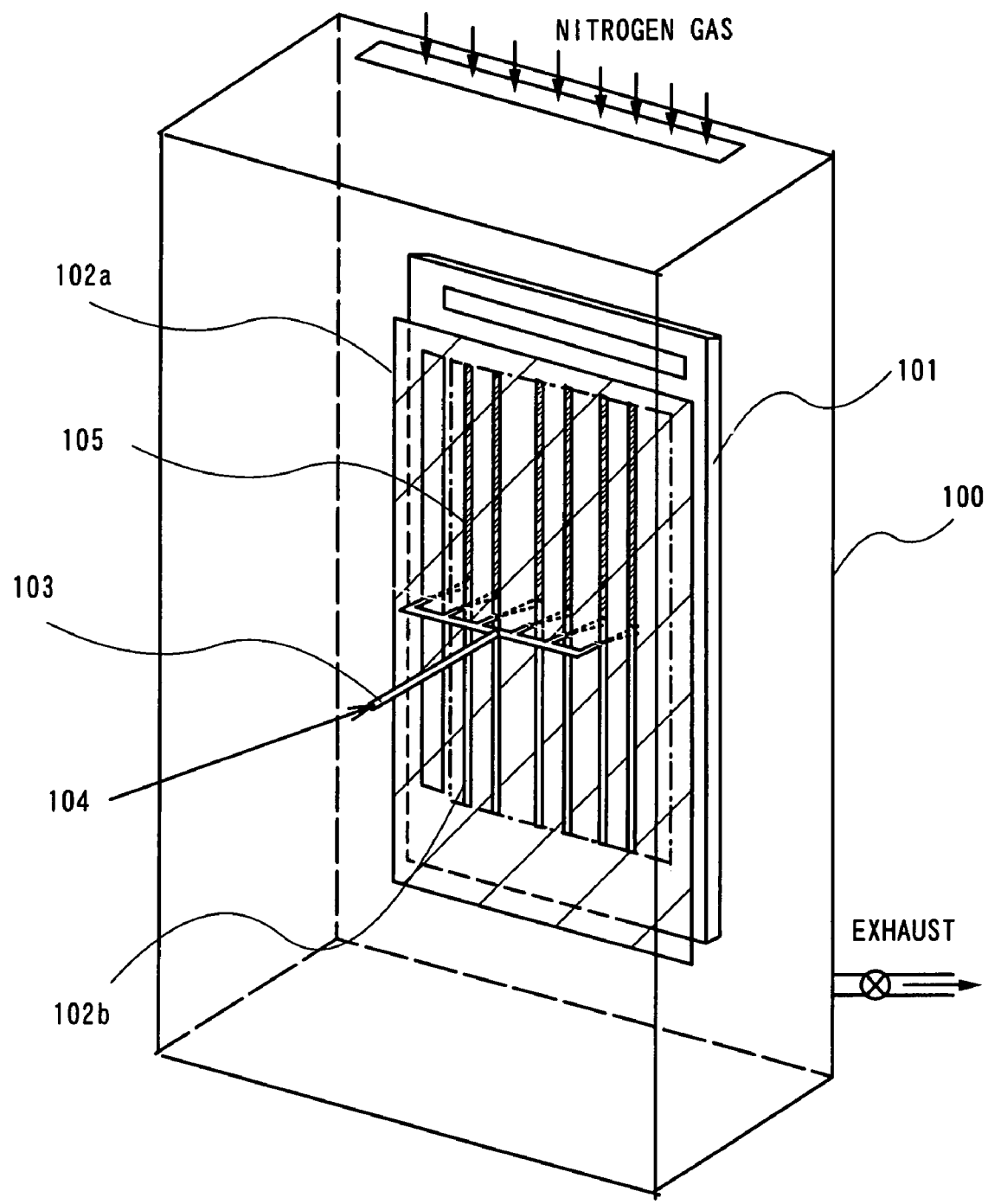
FIG. 1 is a view showing the present invention.

FIG. 1 shows an example in which a plurality of spray outlets are formed. Six spray outlets are formed in FIG. 1, and a line shape pattern is formed on the substrate by the liquid passing through a line shape opening portion 102b formed in the mask 102a.

The atmosphere within a chamber 100 is made into a nitrogen atmosphere, a liquid 104 containing an organic compound is sprayed from a nozzle 103 by using an inert gas, the liquid is selectively expelled to the substrate 101 by passing through the opening portion 102b of the mask disposed between the nozzle and the substrate 101, and burning is performed, thereby forming an organic compound layer 105.

The nozzle is moved in the Y direction (direction perpendicular to the ground) in FIG. 1. The nozzle may also be moved in the X direction (direction parallel to the ground).

This apparatus is suitable for mass production. Further, although a slit shape opening portion is formed here for the mask, there are no particular limitations placed on the shape, and the mask may be appropriately designed as desired.

Further detailed explanation of the present invention having the above structure will be given by the embodiments shown below.

EMBODIMENT

Embodiment 1

A method of manufacturing a pixel portion of a light emitting device is explained in Embodiment 1 using FIGS. 3A to 4C. Further, a case of forming a thin film transistor (TFT) as a semiconductor element is explained in Embodiment 1.

First, a crystalline semiconductor film having a film thickness of 50 nm is formed on a transparent substrate 301. Note that a known means may be used as the method of forming the crystalline semiconductor film. The crystalline semiconductor film is patterned next, forming semiconductor layers 302 and 303 (hereafter referred to as active layers) made from island-shape crystalline semiconductor films. A gate insulating film 304 is then formed from a silicon oxide film, covering the active layers 302 and 303. Gate electrodes 305 and 306 are formed next on the gate insulating film 304. (See FIG. 3A.) An element selected from the group consisting of Ta, W, Ti, Mo, Al, and Cu, or an alloy or a compound material having one of these elements as its main constituent, may be used as the material for forming the gate electrodes 305 and 306. The gate electrodes 305 and 306 are formed here by a tungsten film or a tungsten alloy film having, a film thickness of 350 nm. Further, the gate electrodes may also have a laminate structure with two or more layers. A three layer structure in which a 50 nm thick tungsten film, a 500 nm thick alloy (Al—Si) film of aluminum and silicon, and a 30 nm thick titanium film are laminated in this order may also be used.

Figure 3A:
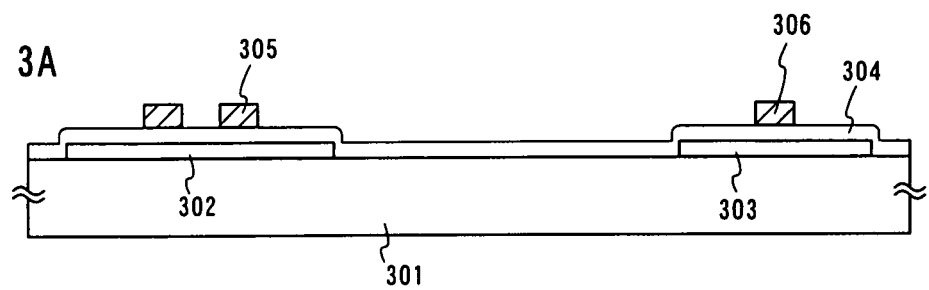
FIGS. 3A to 3E are diagrams showing a process of manufacturing a light emitting device.
Figure 3B:
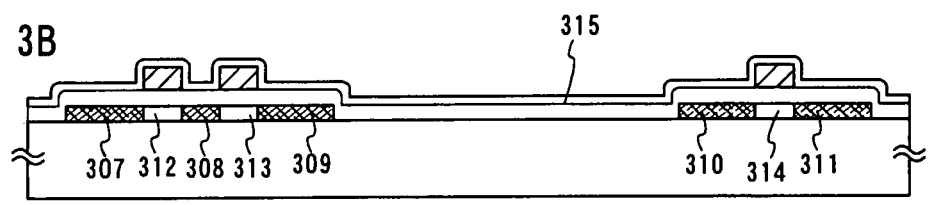

Next, as shown in FIG. 3B, a periodic table group 13 element (typically boron) is added with the gate electrodes 305 and 306 as masks. A known means may be used as the addition method. Impurity regions 307 to 311 having p-type conductivity (the regions are hereafter referred to as p-type impurity regions) are thus formed. Further, channel forming regions 312 to 314 are defined directly below the Gate electrodes 305 and 306. Note that the p-type impurity regions 307 to 311 become TFT source regions or drain regions.

A protective film (a silicon nitride film here) 315 is formed next having a thickness of 50 nm, and heat treatment is then performed, performing activation of the added periodic table group 13 element. Activation may be performed by furnace annealing, laser annealing, or lamp annealing, or by performing a combination of these methods. Heat treatment is performed for 4 hours at 500° C. in a nitrogen atmosphere in Embodiment 1.

It is effective to perform hydrogenation processing after activation is complete. Known hydrogen annealing technique or plasma hydrogenation technique may be used for the hydrogenation process.

Figure 3C:
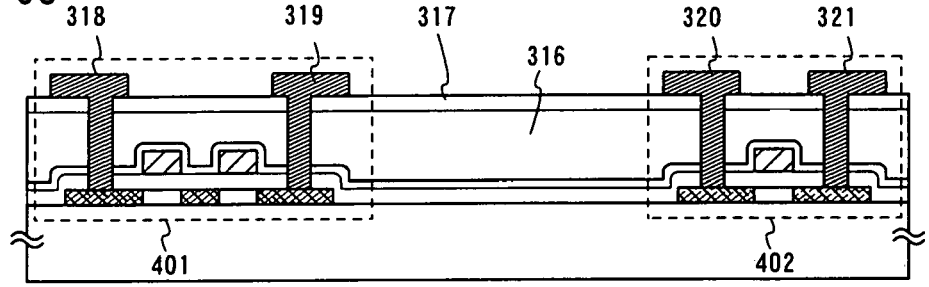

A first interlayer insulating film 316 having a thickness of 800 mm is then formed as shown in FIG. 3C from an organic resin film such as polyimide, acrylic, or polyamide. These materials are first applied using a spinner, and then heated for burning or polymerization, whereby the surface of the resulting film can be made flat. Furthermore, the dielectric constant of organic resin materials is generally low and therefore parasitic capacitance can be lowered. Note that an inorganic insulating film may also be used as the first interlayer insulating film 316.

Next, a second interlayer insulating film 317 is formed on the first interlayer insulating film 316 so that outgassing from the first interlayer insulating film 316 does not have an adverse influence on a light emitting element. The second interlayer insulating film 317 may be formed by an inorganic insulating film, typically a silicon oxide film, a silicon oxynitride film, a silicon nitride film, or a laminate film in which these films are combined. The second interlayer insulating film 317 is formed by plasma CVD at a reaction pressure of 20 to 200 Pa, a substrate temperature of 300 to 400° C., in which electric discharge is performed at high frequency (13.56 MHz) and at an electric power density of 0.1 to 1.0 W/cm². Alternatively, plasma processing of the surface of the interlayer insulating film may be performed to form a hardened film containing one material or a plurality of materials, selected from the group consisting of hydrogen, nitrogen, halocarbon, hydrogen fluoride, and noble gasses.

A resist mask is formed next in a desired pattern, contact holes that reach the drain regions of the TFTs are formed to thereby form wirings 318 to 321. In addition to Al and Ti, alloys of these materials may be used as a conductive metallic film for the wirings, and may be patterned into a desired shape after film formation by sputtering or vacuum evaporation.

The TFTs are complete at this state. A switching TFT 401 and an electric current control TFT 402 are formed in the light emitting device pixel portion in Embodiment 1 as shown in FIG. 3C, and an erasure TFT (not shown in the figures) is also formed at the same time. Note that a gate electrode of the erasure TFT is formed from a portion of the gate wiring 302, differing from the gate wiring 301 forming a gate electrode of the switching TFT 401. Note also that the TFTs in Embodiment 1 are all formed by p-channel TFTs.

In addition, a storage capacitor is also formed at the same time. The storage capacitor is formed by: a lower side storage capacitor formed by a semiconductor layer formed at the same time as the TFT active layers, the gate insulating film, and the wiring that forms the gate electrodes; and an upper side storage capacitor formed by the wiring that forms the gate electrodes, the protective film, the first interlayer insulating film, the second interlayer insulating film, and an electric current supply line. Furthermore, the semiconductor layer may be electrically connected to the electric current supply line.

Figure 3D:
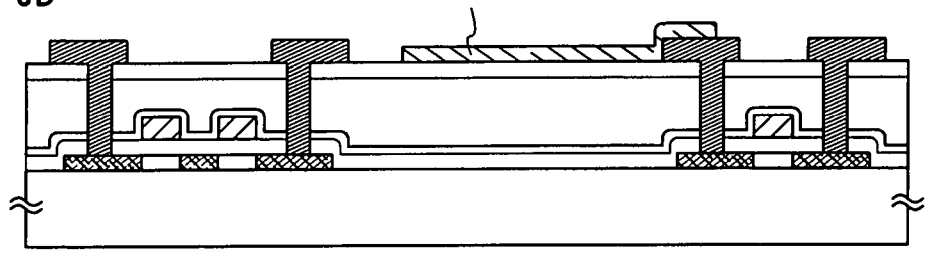

A conductive film having transparency and which becomes an anode of the light emitting element is formed next. An ITO film is formed here. Further, the conductive film is formed using a material having a higher work function than the material forming a cathode, and in addition, a material having a lower sheet resistance than the ITO film, specifically platinum (Pt), chromium (Cr), tungsten (W), or nickel (Ni) can be used. Note that it is preferable that the film thickness of the conductive film be set from 0.1 to 1 μm at this point. The conductive film is then etched, forming an anode 322 as shown in FIG. 3D.

An organic resin film is then formed from polyimide, acrylic, or polyimide amide over the entire surface. Thermosetting materials hardened by heat treatment, or photosensitive materials hardened by irradiation of ultraviolet light can be employed. If a thermosetting material is used, then a resist mask is formed afterward, and an insulating layer 323 having an opening portion over the anode 322 is then formed by dry etching. For cases in which a photosensitive material is used, the insulating layer 323 having the opening portion over the anode 322 is formed by performing exposure and development processes using a photomask. Whichever type of material is used, the insulating layer 323 is formed so as to have a tapered shape border covering an edge portion of the anode 322. The coating of an organic compound film to be formed later can be improved by forming the border with a tapered shape.

An organic compound layers are formed next on the anode 322. Among the organic compound layers formed by organic compounds that display the three types of light emission, namely red, green, and blue, a process for forming a green color organic compound layer is explained in detail below. The organic compound layer for emitting green-color is formed from a hole-injecting organic compound layer, a hole transporting organic compound, a host material, a light emitting organic compound, a blocking organic compound, and an electron transporting organic compound in Embodiment 1, as shown in FIG. 5A. Note that identical reference numerals are used in FIG. 5A for portions corresponding to those of FIGS. 3A to 4C.

First, an organic compound layer (a hole injecting layer 324a) is formed by application or evaporation using copper phthalocyanine (hereafter denoted by Cu-Pc) that is a hole injecting organic compound, with a film thickness of 15 nm. In addition, an organic compound layer (a hole transporting layer 324b) is formed by application or evaporation using 4,4'-bis[N-(1-naphthyl)-N-phenyl-amino]-biphenyl (hereafter denoted by α-NPD) that is a hole transporting organic compound, with a film thickness of 40 nm.

Figure 3E:
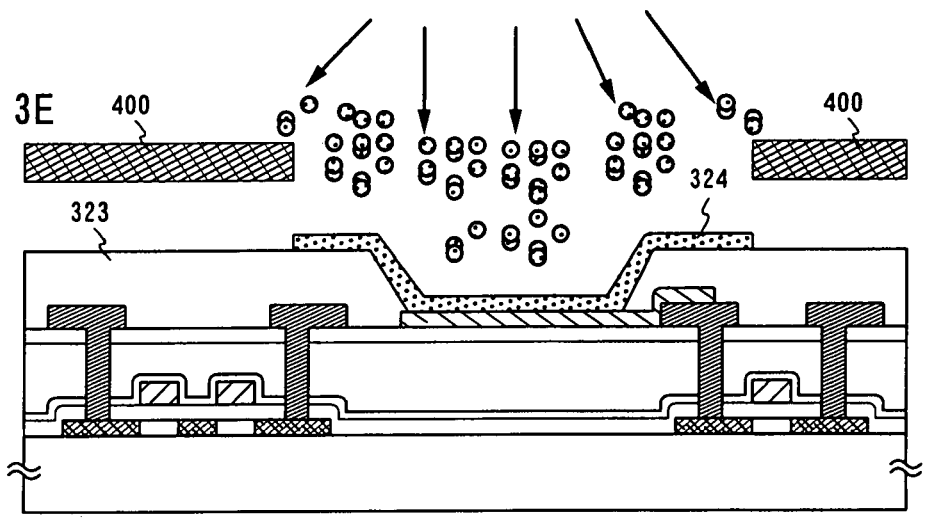

Next, a composition in which an iridium complex as a light emitting organic compound, namely tris(2-phenylpyridine) iridium(Ir(ppy)$_3$), and basocuproin (BCP) as a host organic compound (hereafter referred to as a host material) are dispersed in toluene is sprayed from a nozzle (not shown in the figures) by using nitrogen gas to thereby form an organic compound layer (a light emitting layer 324c), as shown in FIG. 3E. Further, the organic compound layer is selectively formed here using a mask 400. Note that iridium complexes are not soluble in toluene, and that BCP is also not soluble in toluene.

In addition, a composition having the organic compound with blocking characteristics, basocuproin (BCP), dispersed in toluene is sprayed as shown in FIG. 3E by using nitrogen gas, thereby forming an organic compound layer (a blocking layer 324d) having a film thickness of 8 nm.

Next, an organic compound layer (an electron transporting layer 325) is formed from an organic compound having electron transporting characteristics, tris(8-quinolinolate) aluminum (hereafter referred to as Alq$_3$). The electron transporting layer 325 is formed having a film thickness of 25 nm by application or evaporation.

Note that, although a case of forming the green light emitting organic compound layer using five organic compounds having different functions is explained here, the present invention is not limited to this structure. Known materials can also be used as the organic compound displaying green color light emission.

In this example, a case where only the light emitting layer and the blocking layer, from among the five organic compound layers, are formed by using the method disclosed in the embodiment mode, but the present invention is not limited to this structure. At least one layer, or alternatively all of the organic compound layers may be formed by the method disclosed in the embodiment mode.

Then, a cathode 326 is formed by evaporation. (See FIG. 4B.) In addition to MgAg alloys and AlLi alloys, films formed by co-evaporation using a periodic table group 1 or group 2 element together with aluminum can also be used as the cathode 326 material. Note that it is preferable that the film thickness of the cathode 326 be set on the order of 80 to 200 nm.

A light emitting element comprising the anode 322, the organic compound layers 324 and 325, and the cathode 326 can thus be completed as shown in FIGS. 5A and 5B.

Further, a case of forming all of the organic compound layers by using the method disclosed in the embodiment mode is shown in FIG. 5B. Note that identical reference symbols are used in FIG. 5B for portions corresponding to those of FIGS. 3A to 4C. A process for forming a green color organic compound layer is explained here.

FIG. 5B shows a light emitting element in which only an organic compound layer 327 is formed on the anode 322, and the cathode 326 is formed on the organic compound layer 327. In this case, a composition wherein several wt % of an iridium complex is dispersed within a mixed liquid of 2-(4-biphenyl)-5-(4-tert-butylphenyl)-1,3,4-oxadiazole (PBD), poly(N-vinyl carbazole) (PVK), and toluene, may be used. Note that PBD is soluble in toluene, and that PVK is also soluble in toluene. This composition may be sprayed from a nozzle using nitrogen gas as shown in FIG. 3E, thereby forming an organic compound layer (a light emitting layer 324c) having a film thickness of approximately 100 nm. Thereafter, the cathode 326 may be formed by evaporation or another method.

Figure 4A:
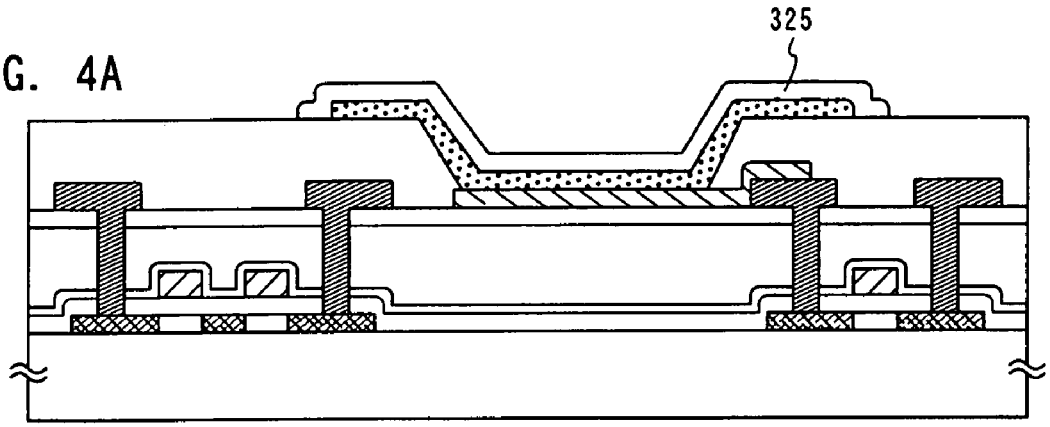
FIGS. 4A to 4C are diagrams showing the process of manufacturing a light emitting device.
Figure 4B:
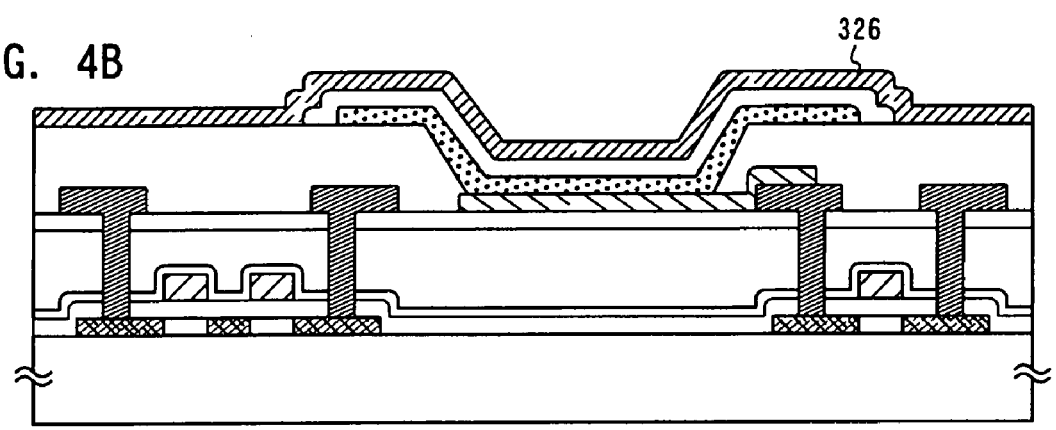
Figure 4C:
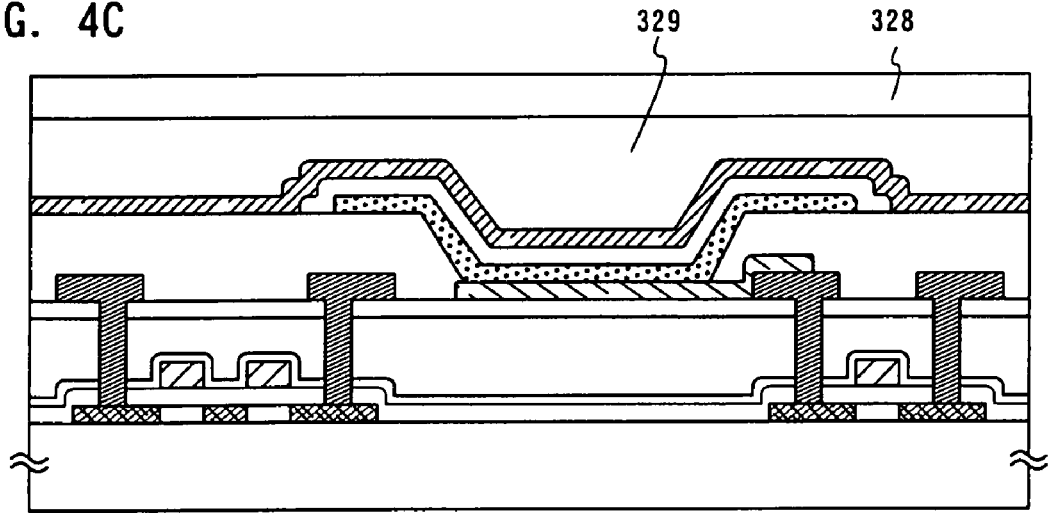

The light emitting element is then sealed using a covering material 328 or the like, and is enclosed, in a space 329 as shown in FIG. 4C. The light emitting element can thus be completely shut off from the outside, and the incursion of substances such as moisture and oxygen from the outside, which are substances that induce degradation of the organic compound layers, can be prevented.

Note that in addition to glass substrates and quartz substrates, plastic substrates made from FRP (fiberglass reinforced plastics), PVF (polyvinyl fluorides), Mylar, polyesters, acrylics or the like can also be used as the cover material 328.

Embodiment 2

An example is shown in Embodiment 1 of using an iridium complex, a low molecular weight material, as an organic compound, but it is also possible to use high molecular weight materials in light emitting layers, as shown below. Note that, except for the organic compound layer, the structure in Embodiment 2 is identical to that of Embodiment 1, and for simplicity a detailed explanation of the identical portions is omitted here. In addition, the same reference numerals in FIGS. 3A to 4C are used in this explanation for portions that are identical to those of Embodiment 1.

Processing is first performed in accordance with Embodiment 1 until immediately before formation of the organic compound layer.

Next, a hole injecting layer 524 is formed on the anode 322 by the method shown in the embodiment mode. A composition in which a material referred to as PEDOT (poly(3,4-ethylene dioxythiophene)) is dissolved by polystyrene sulfonic acid (referred to as PSS) and water is sprayed from a nozzle (not shown in the figures) using nitrogen gas, forming an organic compound layer (the hole injecting layer 524) having a film thickness of 25 to 40 nm. Note that this composition is a liquid in which PEDOT is dissolved in polystyrene sulfonic acid.

A light emitting, layer 525 is formed next on the hole injecting layer 524 by the method shown in the embodiment mode.

It is possible to use the material referred to as PPV, poly(1,4-phenylene vinylene), as the light emitting layer. Its molecular formula is shown below.

[Chem 2]

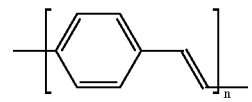

A composition in which PPV is dispersed in toluene is sprayed from a nozzle (not shown in the figures) using nitrogen gas, forming an organic compound layer (the light emitting layer 525) at a film thickness of 70 nm. Note that PPV is not soluble in toluene, and that this composition is a liquid in which PPV is dispersed within toluene. Further, the composition is suitably selected in Embodiment 2 so that the hole injecting layer does not dissolve when forming the light emitting layer.

Figure 6:
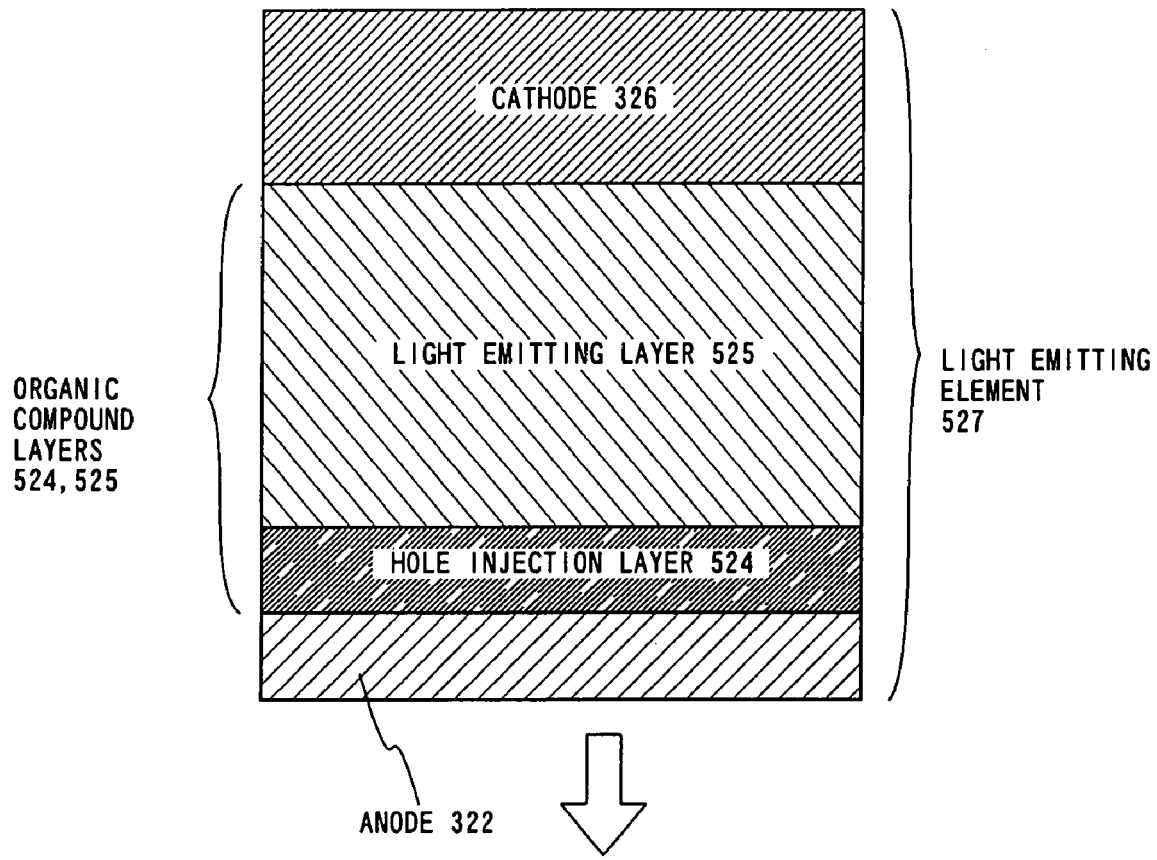
FIG. 6 is a diagram showing the structure of an organic compound layer.

Subsequent processing, such as the formation of the cathode 326, may be performed in accordance with Embodiment 1. A light emitting element 527 comprising the anode 322, the organic compound layers 524 and 525, and the cathode 326 can thus be completed as shown in FIG. 6. The color of light emitted by PPV is green.

With a conventional method, typically an application method, an organic compound material having high solubility is preferably used. An organic compound material referred to as RO-PPV (2,5-dialkoxy-1,4-phenylene vinylene), in which an alkoxy substituent is introduced in order to increase solubility, is used. The color purity therefore drops, and in addition, the color of light emission changes. The color of light emitted by RO-PPV becomes orange.

Further, it is possible to use a material referred to as PNV, poly(1,4-naphthalene vinylene) as a substitute for PPV. Its molecular formula is shown below.

[Chem 3]

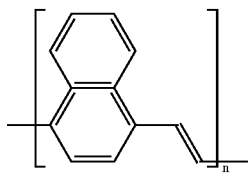

Further, it is also possible to use a material referred to as phenyl-PPV, poly(2-phenyl-1,4-phenylene vinylene). The molecular formula of phenyl-PPV is shown below.

[Chem 4]

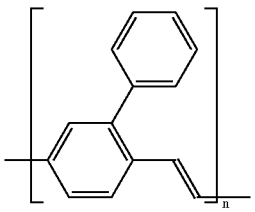

It is also possible to use a material referred to as PT, polythiophene. Its molecular formula is shown below.

[Chem 5]

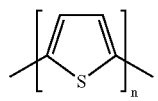

Furthermore, a material referred to as PPT, poly(3-phenyl thiophene) can also be used. The molecular formula of PPT is shown below.

[Chem 6]

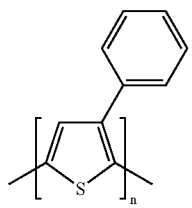

In addition, a material referred to as PPP, poly(1,4-phenylene) can also be used. Its molecular formula is shown below.

[Chem 7]

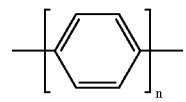

Further, it is also possible to use a material referred to as PF, poly(2,7-fluorene). The molecular formula of PF is shown below.

[Chem 8]

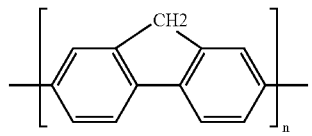

Two, three, or more of the aforementioned materials may also be used in combination.

Note that the above materials are only examples, and that there are no limitations placed on the present invention by these materials. Furthermore, the above materials are not soluble in toluene or in alcohols.

Embodiment 3

An example of using a low molecular weight iridium complex as an organic compound is shown in Embodiment 1. However, in the present invention, it is also possible to use other molecular materials in light emitting layers, as shown below.

It is possible to use a material referred to as quinacridon as a substitute for the iridium complex of Embodiment 1. The molecular formula of quinacridon is shown below.

[Chem 9]

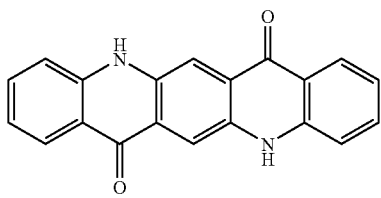

Further, it is also possible to use a material referred to as BCP, basocuproin, as a substitute for the iridium complex of Embodiment 1. Its molecular, formula is shown below.

[Chem 10]

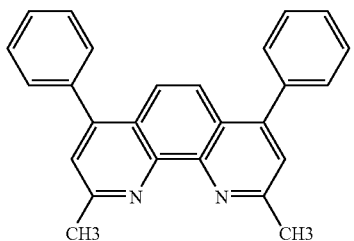

Furthermore, the aforementioned materials may also be used in combination of two, three, or more.

Note that the above materials are not soluble in toluene or in alcohols.

Embodiment 4

Referring to FIG. 7, the external appearance of a light emitting device of the present invention will be described in Embodiment 4.

FIG. 7A is a top view of the light emitting device, and FIG. 7B is a sectional view taken on line A-A' of FIG. 7A. Reference number 701 represents a source signal line driver circuit, which is shown by a dotted line; 702, a pixel portion: 703, a gate signal line driver circuit, 710, a substrate; 704, a cover material; and 705, a sealant. A space 707 is surrounded by the substrate 710, the cover material 704, and the sealant 705.

Reference number 708 represents for transmitting signals inputted to the source signal line driver circuit 701 and the gate signal line driver circuit 703. The connecting wiring 708 receives video signals or clock signals from a flexible print circuit (FPC) 709, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 7B. The driver circuits and the pixel portion are formed oh the substrate 710, but the source signal line driver circuit 701 as one of the driver circuits and the pixel portion 702 are shown in FIG. 7B.

In the source signal line driver circuit 701, a CMOS circuit wherein an n-channel type TFT 713 and a p-channel type TFT 714 are combined is formed. The TFTs constituting the driver circuit may comprise known CMOS circuits, PMOS circuits or NMOS circuits. In Embodiment 4, a driver-integrated type, wherein the driver circuit is formed on the substrate, is illustrated, but the driver-integrated type may not necessarily be adopted. The driver may be fitted not to the substrate but to the outside.

The pixel portion 702 comprises plural pixels including a current-controlling TFT 711 and an anode 712 electrically connected to the drain of the TFT 711.

In the anode 712, slits are made. On the both sides of the anode 712, insulators 715 are formed, and an organic compound layer 717 comprising a hole injection layer 716, a hole generating layer, a hole transport layer, a light emitting layer and an electron transport layer is formed. Furthermore, a cathode 718 is formed on the insulators 715 and the organic compound layer 717. In this way, a light emitting element 719 comprising the anode, the organic compound layer and the cathode is formed.

The cathode 718 also functions as a wiring common to all of the pixels. And the cathode 718 is electrically connected through the interconnection line 708 to the FPC 709.

In order to confine the light emitting element 719 formed on the substrate 710 airtightly, the cover material 704 is adhered to the substrate 710 with the sealant 705. A spacer made of a resin film may be set up to keep a given interval between the cover material 704 and the light emitting element 719. An inert gas such as nitrogen is filled into the space 707 inside the sealant 705. As the sealant 705, an epoxy resin is preferably used. The sealant 705 is desirably made of a material through which water content or oxygen is transmitted as slightly as possible. Furthermore, it is allowable to incorporate a material having moisture absorption effect or a material having anti-oxidation effect into the space 707.

In Embodiment 4, as the material making the cover material 704, there may be used a glass substrate, a quartz substrate, or a plastic substrate made of fiber glass-reinforced plastic (FRP), polyvinyl fluoride (PVF), mylar, polyester or polyacrylic resin.

After the adhesion of the cover material 704 to the substrate 710 with the sealant 705, a sealant is applied so as to cover the side faces (exposure faces).

As described above, the light emitting element is airtightly put into the space 707, so that the light emitting element can be completely shut out from the outside and materials promoting deterioration of the organic compound layer, such as water content and oxygen, can be prevented from invading this layer from the outside. Consequently, the light emitting device can be made highly reliable.

When the light emitting element formed by any one of the structures of Embodiments 1 to 3 is airtightly confined inside a space to manufacture a light emitting device, the structure of Embodiment 4 may be freely combined with the structure.

Embodiment 5

Figure 8A:
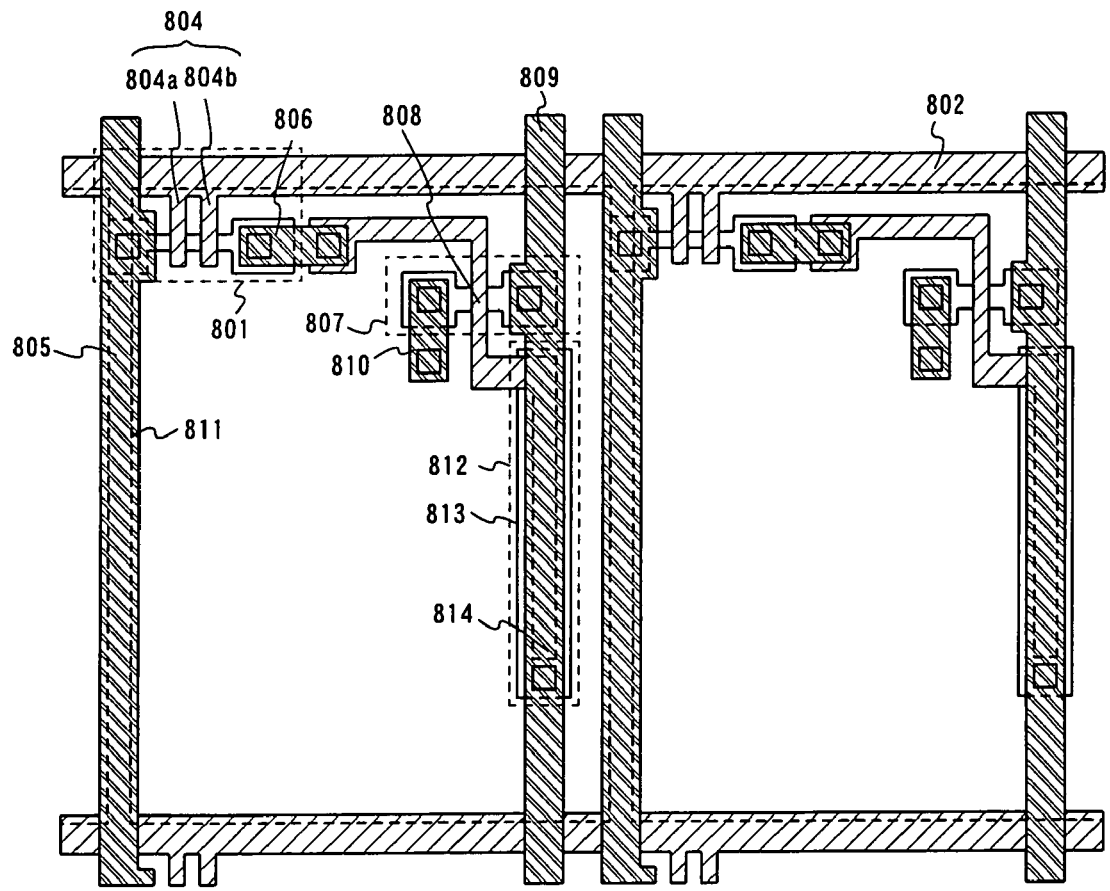
FIGS. 8A and 8B are upper surface diagrams of pixels.
Figure 8B:
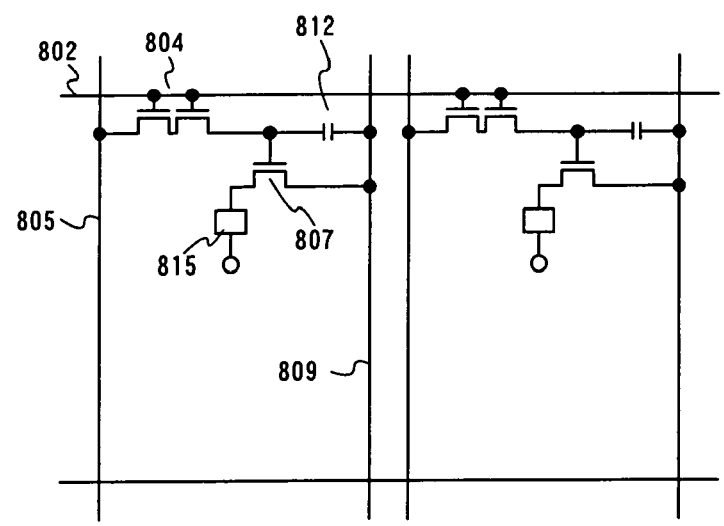

A light emitting, device of the present invention can be made up to a pixel portion illustrated in FIG. 8A. The circuit configuration of the device illustrated in FIG. 8A is illustrated in FIG. 8B.

In FIG. 8A, reference number 801 represents a switching TFT, which is an n-channel type TFT. A wiring 802 is a gate wiring for connecting gate electrodes 804 (804a and 804b) of the switching TFT 801 electrically.

In Embodiment 5, a double-gate structure, wherein two channel-formed areas are laid out, is adopted. However, a single-gate structure, wherein a single channel-formed area is formed, or a triple-gate structure, wherein three channel-formed areas are formed, may be adopted.

The source of the switching TFT 801 is connected to a source wiring 805, and the drain thereof is connected to a drain wiring 806. The drain wiring 806 is electrically connected to a gate electrode 808 of the current-controlling TFT 807. The current-controlling TFT 807 is made up of a p-channel type TFT. In Embodiment 5, a single-gate structure is adopted. However, a double-gate structure or a triple-gate structure may be adopted.

In the Embodiment 5, the switching TFT 801 is made up of an n-channel type TFT, and the current-controlling TFT 807 is made up of a p-channel type TFT. However, the switching TFT 801 may be made up of a p-channel type TFT, and the current-controlling TFT 807 may be made up of an n-channel type, TFT. Both of them may be made up of n-channel type TFTs or p-channel type TFTs.

The source of the current-controlling TFT 807 is electrically connected to a current-supplying line 809, and the drain thereof is electrically connected to a drain wiring 810. The drain wiring 810 is electrically connected to an electrode (anode) 811 shown by a dotted line. By forming an organic compound layer and an electrode (cathode) on the electrode (anode) 811, a light emitting element 815 illustrated in FIG. 8B can be formed.

In a region 812, a retention capacitor (condenser) is formed. The condenser 812 comprises a semiconductor film 813 electrically connected to the current-supplying line 809, an insulating film (not illustrated) as the same layer which constitutes the gate insulating film and a capacitor electrode 814 electrically connected to the gate electrode 808. A capacitor comprising the capacitor electrode 814, the same layer (not illustrated) that constitutes an interlayer dielectric, and the current-supplying line 809 may be used as a retention capacitor.

The structure of the pixel portion described in Embodiment 5 may be combined instead of the pixel portion described in Embodiment 1.

In Embodiment 5, the pixel portion and the TFT of the driver circuit (n-channel type TFT and the p-channel type TFT) to be provided at the periphery of the driver circuit may be formed simultaneously on the same substrate. In addition, the light emitting element electrically connected to the TFT may termed in the pixel portion to manufacture the element substrate.

Embodiment 6

An example of light from a light emitting element being emitted in a downward direction through a substrate is shown in Embodiment 1. In Embodiment 6, however, an example of light emitted from a light emitting element in an upward direction is shown in FIGS. 9A and 9B.

Note that although a glass substrate is used as a substrate 600 in Embodiment 6, quartz substrates, silicon substrates, metallic substrates, and ceramic substrates may also be used.

Figure 9A:
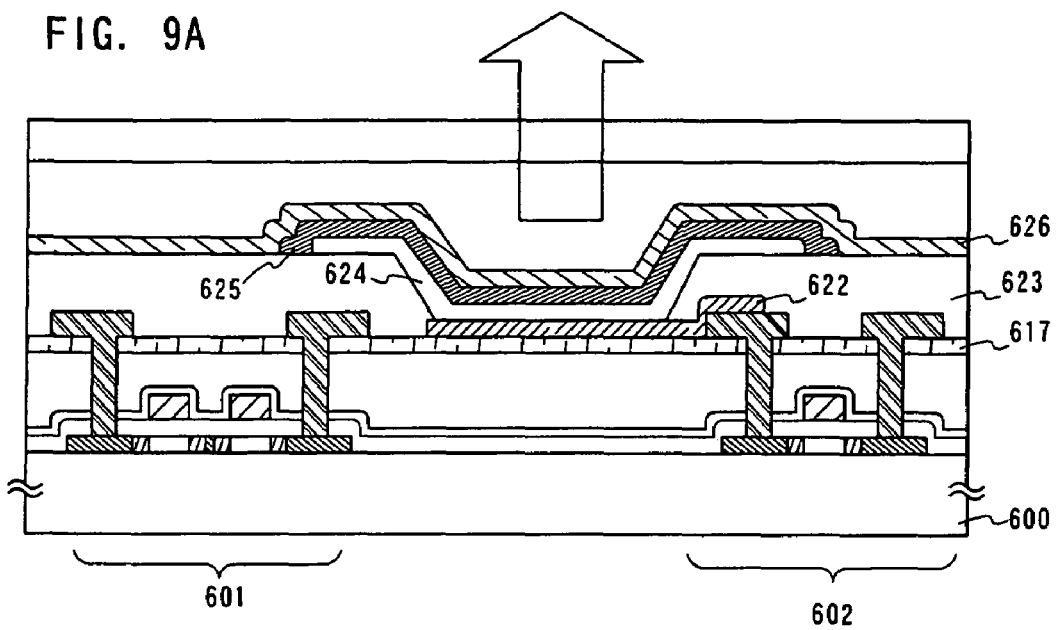
FIGS. 9A and 9B are diagrams showing a light emitting device.

Active layers of each TFT are prepared with at least a channel forming region, a source region, and a drain region in FIG. 9A. Further, the active layers of each TFT are covered by a gate insulating film, and a gate electrode is formed so as to overlap with the channel forming region through the gate insulating film. An interlayer insulating film is formed covering the gate electrode, and electrodes that are electrically connected to the source region or the drain region of each of the TFTs are formed on the interlayer insulating film. A cathode 622 that is electrically connected to a current control TFT 602, an n-channel TFT, is then formed. Further, an insulating layer 623 having an opening portion is formed covering an edge portion of the cathode 622 and having a tapered shape border. An organic compound layer comprising an organic layer 624 and a hole injecting layer 625 is formed on the cathode 622, and an anode 626 is formed on the organic compound layer, thus forming a light emitting element. Note that the light emitting element is sealed by a covering material while maintaining a space.

Figure 9B:
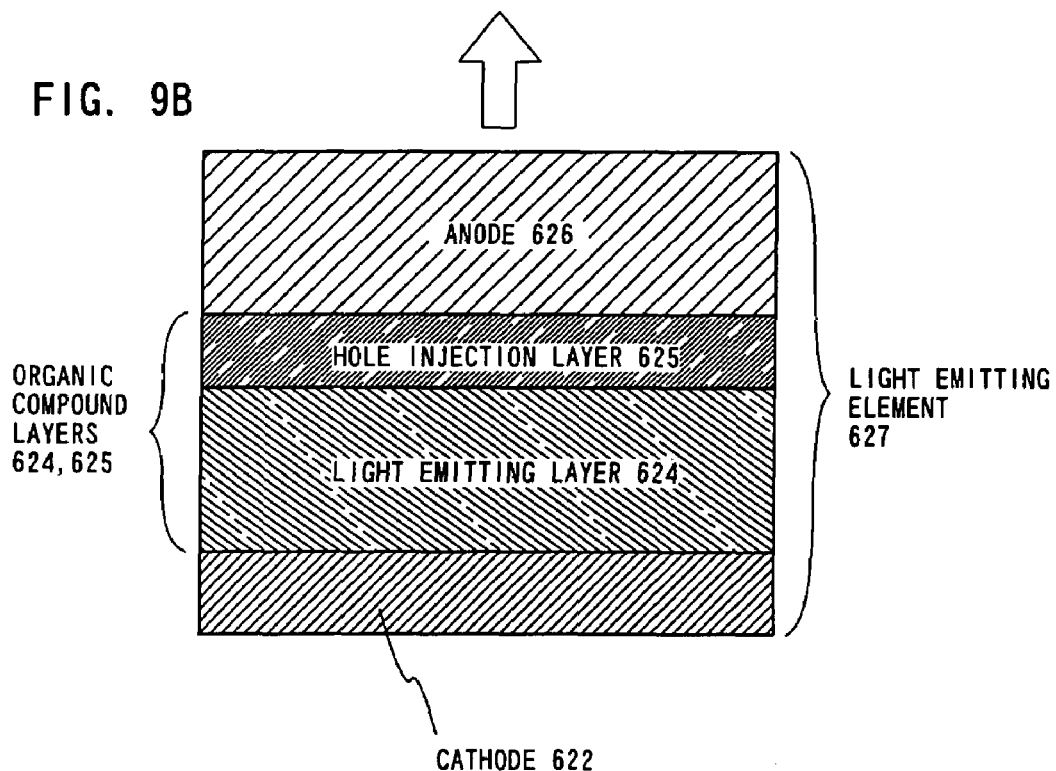

In Embodiment 6, the organic compound layers 624 and 625 shown in FIG. 9B are formed by the method disclosed in the embodiment mode.

First, in accordance with Embodiment 1, the cathode 622 is formed after forming the electrodes, which are electrically connected to the source region or the drain region of each of the TFTs, on the interlayer insulating film. It is preferable to form the cathode using Al or an Al—Li aluminum alloy, which have small work functions. A transparent conductive film is used in the anode, and it is possible to use materials such as a compound of indium oxide and tin oxide (referred to as ITO), a compound of indium oxide and zinc oxide, tin oxide, and zinc oxide for the transparent conductive film.

The insulating layer 623 having an opening portion is formed next covering the edge portion of the cathode 622 and having a tapered shape border, after which the light emitting layer 624 is formed on the cathode 622 by the method shown in the embodiment mode. A composition, in which the material referred to as PPV is dispersed in toluene, is then sprayed from a nozzle (not shown in the figures) by using nitrogen gas, forming an organic compound layer (the light emitting layer 624) at a film thickness of 70 nm. Note that PPV is not soluble in toluene, and this composition is a liquid in which PPV is dispersed within toluene.

Next, a composition having copper phthalocyanine (Cu-Pc) dispersed in toluene is sprayed from a nozzle (not shown in the figures) by using nitrogen gas, forming an organic compound layer (the hole injecting layer 625) at a film thickness of 20 nm. Note that Cu-Pc is not soluble in toluene, and this composition is a liquid in which Cu-Pc is dispersed within toluene.

The anode 626 is formed next, and a light emitting element 627 comprising the anode 626, the organic compound layers 624 and 625, and the cathode 622 can thus be completed.

A light emitting device having a light emitting element with a structure in which light generated by the organic compound layer is extracted in the direction of arrows shown in FIGS. 9A and 9B can be made in accordance with Embodiment 6.

It is possible to use the low molecular weight materials shown in Embodiment 2, and the high molecular weight materials shown in Embodiment 3, for Embodiment 6.

Embodiment 7

A light emitting device using a light emitting element is self-luminous and therefore is superior in visibility in bright surroundings compared to liquid crystal display devices and has wider viewing angle. Accordingly, it can be used for display portions of various electric equipments.

Given as embodiments of electric equipment employing a light emitting device formed by the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device (specifically, a device equipped with a display device which can reproduce a recording medium such as a digital versatile disk (DVD), and can display the image). The light emitting device having a light emitting element is desirable particularly for a portable information terminal since its screen is often viewed obliquely and is required to have a wide viewing angle. Specific embodiments of the electric equipment are shown in FIGS. 10A to 10H.

Figure 10A:
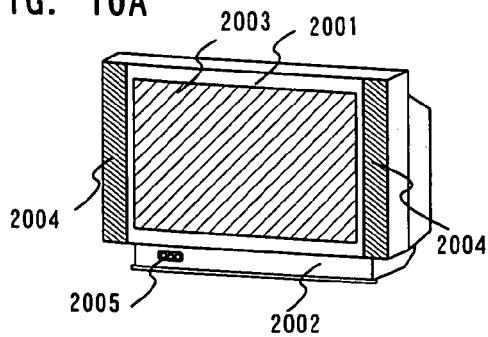
FIGS. 10A to 10H are views showing examples of electronic equipment.

FIG. 10A shows a display device, which comprises a casing 2001, a supporting base 2002, a display portion 2003, speaker portions 2004, a video input terminal 2005, etc. The light emitting device formed by the present invention is applied can be used for the display portion 2003. The light emitting device having a light emitting element is self-luminous and does not need a backlight, so that it can make a thinner display portion than liquid display devices can. The term display device includes every display device for displaying information such as one for a personal computer, one for receiving TV broadcasting, and one for advertisement. In addition, the display shown in FIG. 10A is small-medium type or large type, for example, screen of the display sized 5 to 20 inches. Moreover, it is preferable to mass-produce by executing a multiple pattern using a substrate sized 1×1 m to form such sized display section.

Figure 10B:
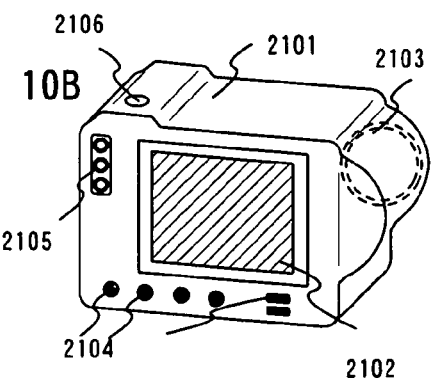

FIG. 10B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102.

Figure 10C:
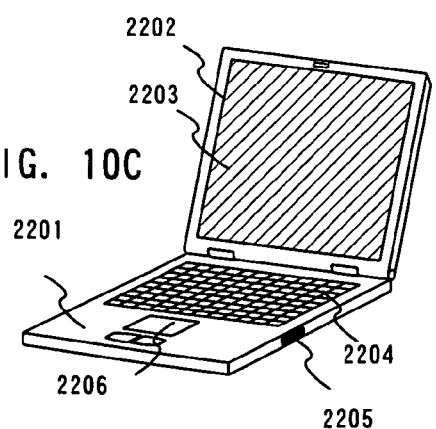

FIG. 10C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203.

Figure 10D:
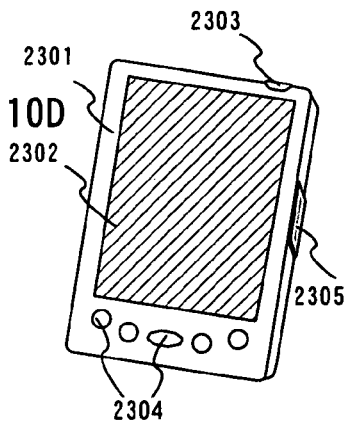

FIG. 10D shows a mobile computer, which comprises a main body 2301, a display portion 2302, a switch 2303, operation keys 2304, an infrared ray port 2305, etc. The light emitting device formed by the present invention is applied can be used for the display portion 2302.

Figure 10E:
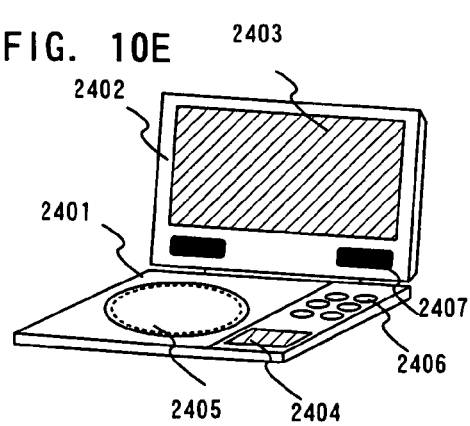

FIG. 10E shows a portable image reproducing device equipped with a recording medium (a DVD player, to be specific). The device comprises a main body 2401, a casing 2402, a display portion A 2403, a display portion B 2404, a recording medium (DVD) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404. The term image reproducing device equipped with a recording medium includes video game machines.

Figure 10F:
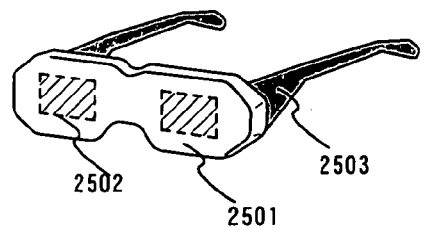

FIG. 10F shows a goggle type display (head mounted display), which comprises a main body 2501, display portions 2502, and arm portions 2503. The light emitting device formed by the present invention is applied can be used for the display portions 2502.

Figure 10G:
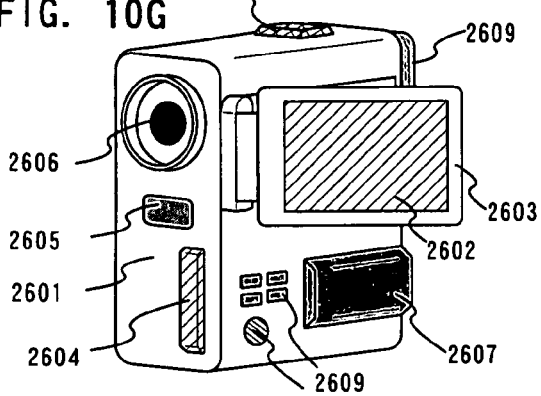

FIG. 10G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, etc. The light emitting device formed by the present invention is applied can be used for the display portion 2602.

Figure 10H:
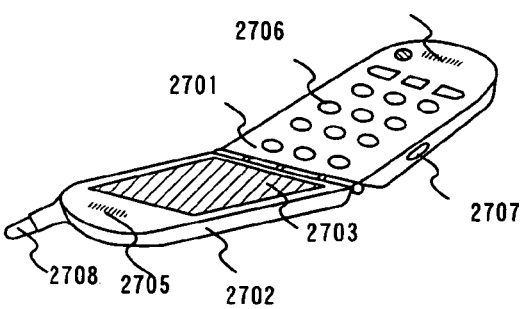

FIG. 10H shows a cellular phone, which comprises a main body 2701, a casing 2702, a display portion 2703, an audio input portion 2704, an audio output portion 2705, operation keys 2706, an external connection port 2707, an antenna 2708, etc. The light emitting device formed by the present invention is applied can be used for the display portion 2703. If the display portion 2703 displays white characters on a black background, power consumption of the cellular phone can be reduced.

If the luminance of light emitted from organic materials is increased in future, the light emitting device having a light emitting element can be used also in a front or rear projector in which light bearing outputted image information is magnified by a lens or the like to be projected on a screen.

The electric equipment given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore, it is desirable to display information such that as small portions as possible emits light. Accordingly, if the light emitting device is used for a display portion that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electric equipment of every field can employ the device. The electric equipments in this embodiment may use the light emitting device formed in Embodiments 1 to 6 to the display portion thereof.

The present invention is a means capable of forming a film from an organic compound material within a liquid, and the organic compound material may be in any state. In, particular, a good quality organic compound film is formed in the present invention using an organic compound material that does not easily dissolve. It therefore becomes possible to use various types of organic compound materials by employing the present invention, and the amount of variation in the color of light emitted by a light emitting device can be increased.

Further, film formation in a relatively short amount of time is possible with the present invention because film formation is performed by spraying a liquid containing an organic compound by using a carrier gas. A method of manufacturing a liquid containing an organic compound to be sprayed can be made into an extremely simple method. Further, film formation is performed with the present invention by using a mask for cases in which a film having a desired pattern is formed, preferably through an opening portion of the mask by using electric field control. In order to effectively use the high cost organic compound material, the organic compound material adhering to the mask is collected, making reuse possible.

What is claimed is:

1. A method of manufacturing a light emitting device comprising:

forming a film containing an organic compound by spraying a composition and an inert gas from a nozzle onto an object, wherein the composition comprises a low molecular weight compound dispersed in a liquid, and wherein the low molecular weight compound is capable of emitting light.

2. A method according to claim 1, wherein the composition is a liquid having fluidity.

3. A method according to claim 1, wherein the low molecular weight compound is one compound or a plurality of compounds selected from the group consisting of quinacridon, tris(2-phenylpyridine) iridium, and basocuproin.

4. A method according to claim 1, wherein the liquid is one liquid or a plurality of liquids, selected from the group consisting of alcohols, toluene, and water.

5. A method according to claim 1, wherein the step of forming the film by spraying is performed under an inert gas atmosphere.

6. A method according to claim 1, wherein the nozzle is provided with one or more spray outlets.

7. A method according to claim 1, wherein the object is a substrate on which a switching element is formed.

8. A method according to claim 1, wherein the film is formed on the object while moving the object.

9. A method according to claim 1, wherein the film is formed on the object while moving the nozzle.

10. A method according to claim 1, wherein an electric field is generated between the nozzle and the object.

11. A method of manufacturing a light emitting device comprising:

forming a film containing an organic compound by spraying a composition and an inert gas from a nozzle onto an object, wherein the composition is dispersed in a liquid, wherein the organic compound is capable of emitting light.

12. A method according to claim 11, wherein the composition is a liquid having fluidity.

13. A method according to claim 11, wherein the liquid is one liquid or a plurality of liquids, selected from the group consisting of alcohols, toluene, and water.

14. A method according to claim 11, wherein the step of forming the film by spraying is performed under an inert gas atmosphere.

15. A method according to claim 11, wherein the nozzle is provided with one or more spray outlets.

16. A method according to claim 11, wherein the object is a substrate on which a switching element is formed.

17. A method according to claim 11, wherein the film is formed on the object while moving the object.

18. A method according to claim 11, wherein the film is formed on the object while moving the nozzle.

19. A method according to claim 11, wherein an electric field is generated between the nozzle and the object.

* * * * *